(12) United States Patent
Kando et al.

(10) Patent No.: US 9,276,558 B2
(45) Date of Patent: Mar. 1, 2016

(54) SURFACE ACOUSTIC WAVE DEVICE INCLUDING A CONFINEMENT LAYER

(71) Applicant: Murata Manufacturing Co., Ltd., Nagaokakyo-shi, Kyoto-fu (JP)

(72) Inventors: Hajime Kando, Nagaokakyo (JP); Keiji Okada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 190 days.

(21) Appl. No.: 14/254,984

(22) Filed: Apr. 17, 2014

(65) Prior Publication Data

US 2014/0225684 A1    Aug. 14, 2014

Related U.S. Application Data

(63) Continuation of application No. PCT/JP2012/077243, filed on Oct. 22, 2012.

(30) Foreign Application Priority Data

Oct. 24, 2011  (JP) ................. 2011-233137

(51) Int. Cl.
*H03H 9/64* (2006.01)
*H03H 9/02* (2006.01)
(Continued)

(52) U.S. Cl.
CPC ............. *H03H 9/64* (2013.01); *H03H 9/02559* (2013.01); *H03H 9/02574* (2013.01);
(Continued)

(58) Field of Classification Search
CPC .......... H03H 9/02559; H03H 9/02574; H03H 9/02622; H03H 9/02834; H03H 9/02866; H03H 9/14594; H03H 9/175; H03H 9/0585; H03H 9/02535; H03H 9/64; H03H 9/6483; H03H 9/6433; H03H 9/725; H03H 9/0042
USPC ......................................... 333/193–196, 133
See application file for complete search history.

(56) References Cited

U.S. PATENT DOCUMENTS

| 7,446,453 | B1 * | 11/2008 | Naumenko | ........ | H03H 9/02559 310/313 A |
|---|---|---|---|---|---|
| 2004/0174233 | A1 | 9/2004 | Takayama et al. | | |
| 2007/0090898 | A1 | 4/2007 | Kando | | |
| 2007/0267942 | A1 | 11/2007 | Matsumoto et al. | | |
| 2010/0207707 | A1 | 8/2010 | Yata | | |

FOREIGN PATENT DOCUMENTS

| CN | 1481074 A | 3/2004 |
|---|---|---|
| CN | 1894850 A | 1/2007 |

(Continued)

OTHER PUBLICATIONS

Official Communication issued in corresponding Chinese Patent Application No. 201280051904.6, mailed on Aug. 17, 2015.
Official Communication issued in International Patent Application No. PCT/JP2012/077243, mailed on Dec. 11, 2012.
Official Communication issued in corresponding European Patent Application No. 12844374.4, mailed on May 11, 2015.

(Continued)

*Primary Examiner* — Barbara Summons
(74) *Attorney, Agent, or Firm* — Keating & Bennett, LLP

(57) ABSTRACT

In a surface acoustic wave device, a plurality of surface acoustic wave elements include piezoelectric bodies having the same cut-angle. A propagation azimuth of a surface acoustic wave in at least one of surface acoustic wave elements is different from a propagation azimuth of a surface acoustic wave in at least another one of the surface acoustic wave elements. In each of the surface acoustic wave elements, a confinement layer configured to confine the surface acoustic wave inside the piezoelectric body is disposed on the piezoelectric body at the side opposite to the side where an electrode is located.

16 Claims, 11 Drawing Sheets

(51) Int. Cl.
  *H03H 9/145* (2006.01)
  *H03H 9/00* (2006.01)
  *H03H 9/17* (2006.01)
  *H03H 9/72* (2006.01)
  *H03H 9/05* (2006.01)

(52) U.S. Cl.
  CPC ...... *H03H 9/02622* (2013.01); *H03H 9/02834* (2013.01); *H03H 9/02866* (2013.01); *H03H 9/14594* (2013.01); *H03H 9/6483* (2013.01); *H03H 9/0042* (2013.01); *H03H 9/02535* (2013.01); *H03H 9/0585* (2013.01); *H03H 9/175* (2013.01); *H03H 9/6433* (2013.01); *H03H 9/725* (2013.01)

(56) References Cited

FOREIGN PATENT DOCUMENTS

| | | |
|---|---|---|
| EP | 1 903 676 A1 | 3/2008 |
| JP | 08-065089 A | 3/1996 |
| JP | 2006-121259 A | 5/2006 |
| WO | 03/088483 A1 | 10/2003 |
| WO | 2005/060094 A1 | 6/2005 |

OTHER PUBLICATIONS

Hashimoto, K. "Introduction to Surface Acoustic Wave (SAW) Devices", Jan. 1, 2007, 69 pages.

* cited by examiner

SURFACE ACOUSTIC WAVE DEVICE INCLUDING A CONFINEMENT LAYER

BACKGROUND OF THE INVENTION

1. Field of the Invention

The present invention relates to a surface acoustic wave device including a plurality of surface acoustic wave elements each of which includes a piezoelectric body, and more particularly, to a surface acoustic wave device utilizing, as a surface acoustic wave, a surface acoustic wave having a higher acoustic velocity than a bulk wave that propagates in the piezoelectric body.

2. Description of the Related Art

Surface acoustic wave devices have widely been used in a resonator and a band pass filter. The surface acoustic wave device can constitute resonators and filters in various frequency ranges depending on the types of surface acoustic waves utilized.

WO2003/088483 discloses a surface acoustic wave device utilizing a leaky surface acoustic wave among the plural types of surface acoustic waves.

Japanese Unexamined Patent Application Publication No. 8-65089 discloses a ladder filter using a surface acoustic wave resonator. In the disclosed ladder filter, an electric capacity is added to the surface acoustic wave resonator in series or in parallel. Japanese Unexamined Patent Application Publication No. 8-65089 states that a pass band width can be narrowed, for example, by adding the capacity.

On the other hand, WO2005/060094 discloses a boundary acoustic wave device utilizing a non-leaky propagation boundary acoustic wave. In WO2005/060094, a plurality of interdigital transducers (IDTs) are disposed on one piezoelectric single-crystal, and a propagation azimuth of an IDT is set to be different from that of at least another one IDT. As a result, according to WO2005/060094, a band width can be adjusted.

In the surface acoustic wave device utilizing the leaky surface acoustic wave, disclosed in WO2003/088483, it is also necessary to adjust the band width and resonance characteristics.

On the other hand, Japanese Unexamined Patent Application Publication No. 8-65089 states that, in the disclosed ladder filter, the band width can be adjusted by adding the capacity to the surface acoustic wave element in series or in parallel. However, such an arrangement has the problem that, because of the necessity of adding the capacity, the size of the surface acoustic wave device is increased and the cost is increased.

According to WO2005/060094, in the structure including a plurality of IDTs formed on one piezoelectric substrate, the propagation azimuth of at least one boundary acoustic wave element is set to be different from that of other boundary acoustic wave elements. The disclosed structure enables the band width to be adjusted without connecting an additional capacity.

However, the surface acoustic wave device utilizing the leaky surface acoustic wave, disclosed in WO2003/088483, has the problem that a propagation loss increases when propagation azimuths of plural surface acoustic wave elements are set to be different. The reason is that because the acoustic velocity of a leaky surface acoustic wave is higher than that of a slow transversal wave in the piezoelectric substrate, energy of the leaky surface acoustic wave leaks toward the piezoelectric substrate. In the surface acoustic wave device utilizing the leaky surface acoustic wave, therefore, sufficient or satisfactory filter characteristics and resonance characteristics cannot be obtained with the method of setting the propagation azimuths of plural surface acoustic wave elements to be different.

SUMMARY OF THE INVENTION

Preferred embodiments of the present invention provide a surface acoustic wave device, which utilizes a surface acoustic wave having a higher acoustic velocity than a bulk wave that propagates in a piezoelectric body, which adjusts a band width without connecting an additional capacity, and which has a sufficiently small propagation loss.

According to a preferred embodiment of the present invention, a plurality of surface acoustic wave elements include piezoelectric bodies having the same cut-angle, and are each configured to use a surface acoustic wave with a higher acoustic velocity than a bulk wave that propagates in the piezoelectric body. Each of the surface acoustic wave elements includes the piezoelectric body, an IDT electrode disposed on the piezoelectric body, and a confinement layer. The confinement layer is disposed on the piezoelectric body at the side opposite to the side where the IDT electrode is disposed, and is configured to confine the surface acoustic wave inside the piezoelectric body.

According to a preferred embodiment of the present invention, in the plural surface acoustic wave elements, a propagation azimuth of the surface acoustic wave in at least one surface acoustic wave element is different from a propagation azimuth of the surface acoustic wave in at least another one surface acoustic wave element.

In one specific aspect of the surface acoustic wave device according to a preferred embodiment of the present invention, the plural surface acoustic wave elements are preferably provided on a single piezoelectric body. In this case, the size of the surface acoustic wave device is significantly reduced.

In another specific aspect of the surface acoustic wave device according to a preferred embodiment of the present invention, a band width of at least one of the surface acoustic wave elements is different from a band width of at least another one surface acoustic wave element.

In still another specific aspect of the surface acoustic wave device according to a preferred embodiment of the present invention, the confinement layer is made of a dielectric selected such that an acoustic velocity of a bulk wave propagating in the confinement layer is higher than a propagation velocity of the surface acoustic wave. In this case, the surface acoustic wave hardly propagates in the confinement layer, and wave energy is confined on the surface side. Hence the propagation loss is substantially 0.

In still another specific aspect of the surface acoustic wave device according to a preferred embodiment of the present invention, the above-mentioned dielectric is preferably made of one type of dielectric, or a mixture or a stack of plural dielectrics selected from among a group consisting of aluminum nitride, silicon nitride, aluminum oxide, silicon carbide, silicon oxynitride, DLC, diamond, sapphire, alumina, magnesia, and silicon, as well as lithium tantalate and lithium niobate each having a cut-angle selected such that an acoustic velocity of a bulk wave propagating therein is faster than the propagation velocity of the surface acoustic wave.

In still another specific aspect of the surface acoustic wave device according to a preferred embodiment of the present invention, the surface acoustic wave is a transversal wave, and a thickness of the IDT electrode is preferably set to a thickness at which an acoustic velocity of the surface acoustic wave is higher than an acoustic velocity of a slow transversal wave propagating in the piezoelectric body. In this case, since the acoustic velocity of the surface acoustic wave is higher than that of a non-leaky surface acoustic wave, the IDT pitch is increased. As a result, a filter that is more suitable for use in a higher frequency range is provided.

In still another specific aspect of the surface acoustic wave device according to a preferred embodiment of the present invention, the surface acoustic wave is a longitudinal wave, and a thickness of the IDT electrode is preferably set to a thickness at which an acoustic velocity of the surface acoustic wave is higher than an acoustic velocity of a longitudinal bulk wave propagating in the piezoelectric body.

In still another specific aspect of the surface acoustic wave device according to a preferred embodiment of the present invention, the surface acoustic wave is a transversal wave, and a duty ratio of the IDT electrode is preferably set to a duty ratio at which the surface acoustic wave is faster than an acoustic velocity of a slow transversal wave propagating in the piezoelectric body. In this case, since the acoustic velocity of the surface acoustic wave is higher than that of a non-leaky surface acoustic wave, the IDT pitch is increased. As a result, a filter that is more suitable for use in a higher frequency range is provided.

The surface acoustic wave is a longitudinal wave, and a duty ratio of the IDT electrode is preferably set to a duty ratio at which the surface acoustic wave is faster than an acoustic velocity of a longitudinal bulk wave propagating in the piezoelectric body.

In still another specific aspect of the surface acoustic wave device according to a preferred embodiment of the present invention, the surface acoustic wave device also includes a low acoustic velocity layer in which an acoustic velocity of a bulk wave therein is lower than an acoustic velocity of a bulk wave propagating in the piezoelectric body and lower than an acoustic velocity of a bulk wave propagating in the confinement layer, the low acoustic velocity layer being disposed between the piezoelectric body and the confinement layer. In this case, the band width is also preferably adjusted with the formation of the low acoustic velocity layer. Preferably, the low acoustic velocity layer is made of silicon oxide, for example. In such a case, an absolute value of the temperature coefficient of frequency (TCF) is reduced.

In still another specific aspect of the surface acoustic wave device according to a preferred embodiment of the present invention, the confinement layer is a Bragg reflector in which a first material layer having a relatively high acoustic impedance and a second material layer having a relatively low acoustic impedance are stacked. In this case, the propagation loss is reduced.

Preferably, the first material layer is made of at least one selected from a group consisting of Cu, Au, Mo, Ni and W. In this case, the acoustic impedance of the first material layer is increased effectively. Therefore, the difference in acoustic impedance between the first and second material layers is increased, and the reflection efficiency for the surface acoustic wave is increased.

Preferably, the second material layer is made of silicon oxide or a polymer. In this case, the acoustic impedance of the second material layer is reduced sufficiently. Therefore, the difference in acoustic impedance between the first and second material layers is increased. As a result, the reflection efficiency for the surface acoustic wave is increased.

While the surface acoustic wave device according to various preferred embodiments of the present invention can be applied to various types of surface acoustic wave devices each including a plurality of surface acoustic wave elements, it is preferably a filter or a resonator. In the case of a filter or a resonator, according to various preferred embodiments of the present invention, the band width is easily adjusted, and a filter or a resonator having a small propagation loss is provided. Preferably, a longitudinally coupled surface acoustic wave filter is configured according to one of the various preferred embodiments of the present invention. Thus, it is possible to provide a longitudinally coupled surface acoustic wave filter, which easily adjusts its band width and which has a small propagation loss.

With the surface acoustic wave device according to various preferred embodiments of the present invention, since each surface acoustic wave element includes the confinement layer, the propagation loss of the surface acoustic wave is reduced sufficiently in spite of utilizing the surface acoustic wave that has a higher acoustic velocity than a bulk wave propagating in the piezoelectric body. Therefore, the band width is adjusted without reducing the propagation loss by setting the propagation azimuth of the surface acoustic wave in at least one surface acoustic wave element to be different from the propagation azimuth of the surface acoustic wave in at least another one surface acoustic wave element.

In addition, since an additional capacity is not needed for the adjustment of the band width, the size of the surface acoustic wave device is not increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be apparent from the following description of practical preferred embodiments of the present invention with reference to the drawings.

Figure 1A:
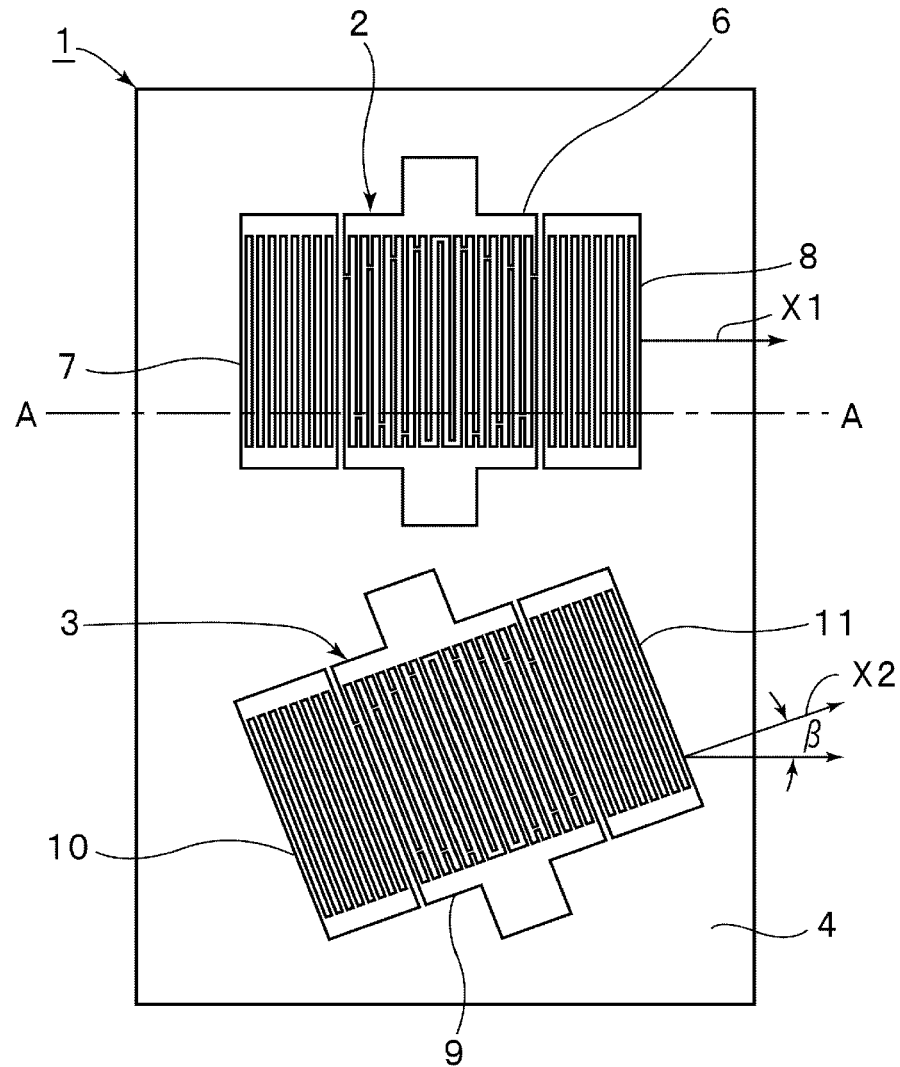
FIGS. 1A and 1B are respectively a schematic plan view and a front sectional view, partly cut out, of a surface acoustic wave device according to a preferred embodiment of the present invention.
Figure 1B:
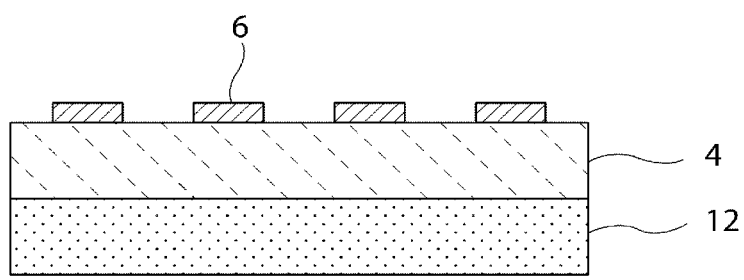

FIGS. 1A and 1B are respectively a schematic plan view and a front sectional view, illustrating principal portion, of a surface acoustic wave device according to a preferred embodiment of the present invention.

As illustrated in FIG. 1A, a surface acoustic wave device 1 includes an electrode structure configured to define a plurality of surface acoustic wave elements that are represented by first and second surface acoustic wave elements 2 and 3. More specifically, an IDT electrode 6 and reflectors 7 and 8 positioned on both sides of the IDT electrode 6 are configured to constitute the first surface acoustic wave element 2. Similarly, an IDT electrode 9 and reflectors 10 and 11 positioned on both sides of the IDT electrode 9 are configured to constitute the second surface acoustic wave element 3. The first and second surface acoustic wave elements 2 and 3 utilize an SH (Shear Horizontal) surface acoustic wave having a higher acoustic velocity than a bulk wave that propagates in a piezoelectric body.

A propagation azimuth of the surface acoustic wave in the first surface acoustic wave element 2 and a propagation azimuth of the surface acoustic wave in the second surface acoustic wave element 3 are different from each other as illustrated. More specifically, when the propagation azimuth of the surface acoustic wave in the first surface acoustic wave element 2 is denoted by X1, the propagation azimuth X2 of the surface acoustic wave in the second surface acoustic wave element 3 forms an angle β relative to the propagation azimuth X1. In the surface acoustic wave device 1 of this preferred embodiment, since the propagation azimuth X2 of the surface acoustic wave in the second surface acoustic wave element 3 is different from the propagation azimuth X1 of the surface acoustic wave in the first surface acoustic wave element 2, a band width is adjusted as described later.

FIG. 1B is a schematic front sectional view of a portion of the surface acoustic wave device 1 in which the IDT electrode 6 is provided. As illustrated in FIG. 1B, the IDT electrode 6 is provided on a piezoelectric body 4. In this preferred embodiment, the piezoelectric body 4 is preferably made of LiTaO₃. The IDT electrode 6 preferably is made of Al. The piezoelectric body 4 may be made of another type of piezoelectric body, such as LiNbO₃. The IDT electrode 6 may be made of Cu, Ag, Au, Pt, W, Ti, Ni or Cr other than Al, or an alloy containing one of those elements as a main component. Furthermore, the IDT electrode 6 may be a multilayer metal film including a plurality of stacked metal layers.

In this preferred embodiment, the surface acoustic wave device 1 utilizes the surface acoustic wave having a higher acoustic velocity than the bulk wave that propagates in the piezoelectric body, the propagation azimuth X1 of the surface acoustic wave and the propagation azimuth X2 of the surface acoustic wave are different from each other as described above, and a confinement layer 12 is provided.

As illustrated in FIG. 1B, the confinement layer 12 is stacked adjacent to a lower surface of the piezoelectric body 4. More specifically, the confinement layer 12 is stacked adjacent to a surface of the piezoelectric body 4 on the side opposite to the side where the IDT electrode 6 is provided. The confinement layer 12 is made of a material selected such that the acoustic velocity of a bulk wave propagating in the confinement layer 12 is higher than that of an elastic wave propagating in the piezoelectric body 4. In this preferred embodiment, the confinement layer 12 preferably is made of silicon nitride, and the acoustic velocity of the bulk wave therein is about 5950 m/sec, for example. On the other hand, the acoustic velocity of the SH surface acoustic wave in LiTaO$_3$ is about 3200 m/sec to about 4300 m/sec, for example, though depending on Euler Angles, an electrode thickness, and so on.

As well known, a bulk wave propagating in a solid is categorized as a longitudinal wave, i.e., P wave, and a transversal wave. When the solid is anisotropic, two types of transversal waves, i.e., an SH (Shear Horizontal) wave and an SV (Shear Vertical) wave, propagate in the solid. Of those waves, the transversal wave having the lowest acoustic velocity is called a slow transversal wave, and the transversal wave having a higher acoustic velocity is called a fast transversal wave. Which one of the SH wave and the SV wave becomes the slow transversal wave is determined depending on anisotropy of the solid. In LiTaO$_3$ or LiNbO$_3$ with the rotated Y Cut X SAW propagation and thereabout, of the bulk waves, the SV wave becomes the slow transversal wave, and the SH wave becomes the fast transversal wave.

Herein, the term "bulk wave" is defined as follows. When an elastic wave propagating along the surface of a piezoelectric body is an elastic wave mainly containing an SH component, such as a leaky wave or a Love wave, the bulk wave in a medium having anisotropy, e.g., a piezoelectric body, implies an SH bulk wave. The bulk wave in a medium having isotropy implies a transversal bulk wave. When an elastic wave propagating along the surface of a piezoelectric body is an elastic wave in which an SV wave and a P wave are coupled with each other, such as a Rayleigh wave, the bulk wave in a medium having anisotropy implies an SV bulk wave. The bulk wave in a medium having isotropy implies a transversal bulk wave. On the other hand, when an elastic wave propagating along the surface of a piezoelectric body is an elastic wave mainly containing a longitudinal wave component, each of the bulk wave in the piezoelectric body and the bulk wave in the confinement layer implies a longitudinal bulk wave.

The terms "leaky wave" and "non-leaky wave" are defined as follows. Whether a surface acoustic wave propagating along the surface of a piezoelectric body becomes a leaky propagation surface acoustic wave or a non-leaky propagation surface acoustic wave is determined depending on the relationship between the acoustic velocity of the surface acoustic wave and the acoustic velocity of the bulk wave in the piezoelectric body. When a wave propagating along the surface of a piezoelectric body is a transversal wave, i.e., a surface acoustic wave mainly containing an SH component or a surface acoustic wave mainly containing an SV component, the leaky propagation surface acoustic wave is generated in the case where the acoustic velocity of the surface acoustic wave provides a higher propagation velocity than that of the slow transversal wave in the piezoelectric body. In the case where the acoustic velocity of the surface acoustic wave is lower than that of the slow transversal wave in the piezoelectric body, the non-leaky propagation surface acoustic wave is generated. When a wave propagating along the surface of a piezoelectric body is a longitudinal wave, the leaky propagation surface acoustic wave is generated in the case where the acoustic velocity of the surface acoustic wave provides a higher propagation velocity than that of the longitudinal bulk wave in the piezoelectric body, and the non-leaky propagation surface acoustic wave is generated in the case where the acoustic velocity of the surface acoustic wave is lower than that of the longitudinal bulk wave in the piezoelectric body. It is to be noted that the acoustic velocity of the slow transversal wave in rotated Y cut LiTaO$_3$ is about 3367 m/sec, and the acoustic velocity of the slow transversal wave in LiNbO$_3$ is about 4031 m/sec, for example.

According to WO2005/060094, as described above, the band width can be adjusted in the boundary acoustic wave device utilizing the non-leaky propagation boundary acoustic wave by setting the propagation azimuth of the non-leaky propagation boundary acoustic wave excited by an IDT and the propagation azimuth of the non-leaky propagation boundary acoustic wave excited by another IDT to be different from each other. In the case of utilizing the leaky propagation surface acoustic wave, however, a problem occurs in that the propagation loss increases when the propagation azimuth is changed.

On the other hand, in the surface acoustic wave device 1 of the present preferred embodiment of the present invention, since the confinement layer 12 is disposed, the surface acoustic wave having a higher acoustic velocity than the bulk wave propagating in the piezoelectric body, i.e., the leaky propagation surface acoustic wave, is confined inside the piezoelectric body 4. Therefore, the propagation loss is held substantially at 0. Such a point is described in more detail below by comparing EXAMPLE 1 and COMPARATIVE EXAMPLE 1 with each other.

A surface acoustic wave device, described below, was fabricated as EXAMPLE 1.

Specifications of Example 1

Al(0.08)/LT(0.5)/SiN(2.0) Euler Angles ($\phi$, $\theta$, $\psi$) of LT=(0 to 30, 0 to 180, 0 to 180)

Unit of film thickness of each of the electrode and the piezoelectric body: wavelength [$\lambda$] Wavelength: 2 µm Including the confinement layer Specifications of Comparative Example 1

Al(0.08)/LT(200) Euler Angles ($\phi$, $\theta$, $\psi$) of LT=(0, 128.5, −15 to 15)

Unit of film thickness of each of the electrode and the piezoelectric body: wavelength [$\lambda$] Wavelength: 2 µm Including no confinement layer In EXAMPLE 1 and COMPARATIVE EXAMPLE 1, the propagation loss was measured while the propagation azimuth was changed. As a result, in the case using LiTaO$_3$ having Euler Angles (0°, $\theta$, $\psi$), an energy concentration ratio of the leaky propagation surface acoustic wave was 100% even when $\theta$ was changed in order of 0°, 15°, 30°, 45°, 60°, 75°, 90°, 105°, 120°, 135°, 150°, 165° and 180°, and $\psi$ was changed in order 0°, 30°, 60°, 90°, 120°, 150° and 180°. Thus, no leakage was found. Furthermore, in EXAMPLE 1, even when Euler Angle $\phi$ of LiTaO$_3$ was set to 15° or 30° and $\theta$ and $\psi$ were changed in a similar manner to that in the above-described case, the energy concentration ratio was held at 100% and no leakage occurred.

Figure 23:
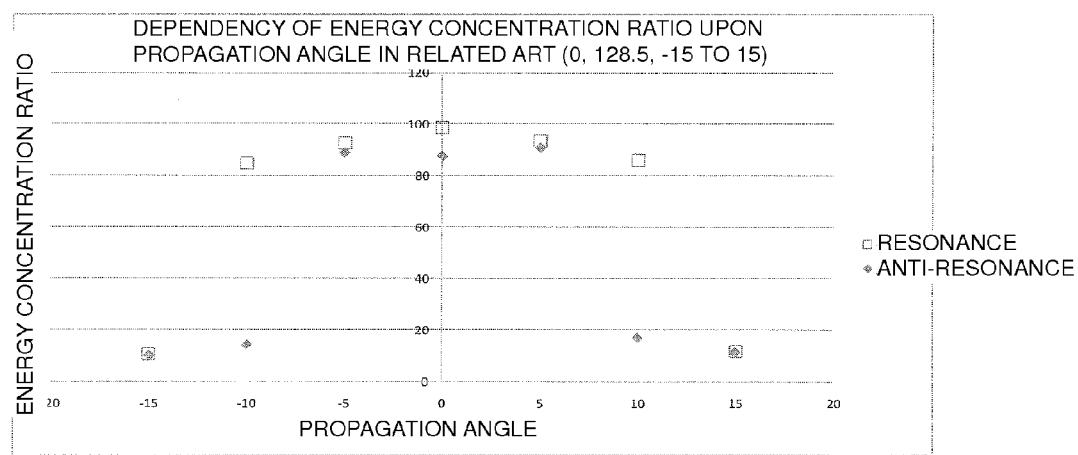
FIG. 23 is a graph representing dependency of an energy concentration ratio of a leaky propagation surface acoustic wave upon a propagation azimuth ψ in COMPARATIVE EXAMPLE 1.

In COMPARATIVE EXAMPLE 1, however, the energy concentration ratio of the leaky propagation surface acoustic wave was greatly changed, as plotted in FIG. 23, depending on the propagation azimuth $\psi$ in LiTaO$_3$ having Euler Angles (0°, 128.5°, $\psi$) when the propagation azimuth $\psi$ was changed.

As seen from FIG. 23, when the propagation azimuth is changed, the propagation loss increases depending on the propagation azimuth in COMPARATIVE EXAMPLE 1. In contrast, in EXAMPLE 1, the propagation loss is substantially 0 even when the propagation azimuth is changed.

In the surface acoustic wave device 1 of this preferred embodiment, as described above, since the confinement layer 12 is provided, the propagation loss of the surface acoustic wave is held substantially at 0 regardless of the propagation azimuth. Stated in another way, when the confinement layer has a sufficient thickness, the propagation loss of a main propagation mode having a higher acoustic velocity than the bulk wave propagating in the piezoelectric body is 0 and the non-leaky surface acoustic wave is generated. Even when the confinement layer is relatively thin, the effect of suppressing the leakage is obtained and a main propagation mode is generated as the leaky propagation surface acoustic wave having a small propagation loss.

Furthermore, in this preferred embodiment, as described above, the propagation azimuth X1 of the surface acoustic wave in the first surface acoustic wave element 2 and the propagation azimuth X2 of the surface acoustic wave in the second surface acoustic wave element 3 are different from each other. In that arrangement, the band width can be adjusted by adjusting the difference in the propagation azimuth. Such a point will be described below with reference to FIGS. 2 to 4.

Figure 2:
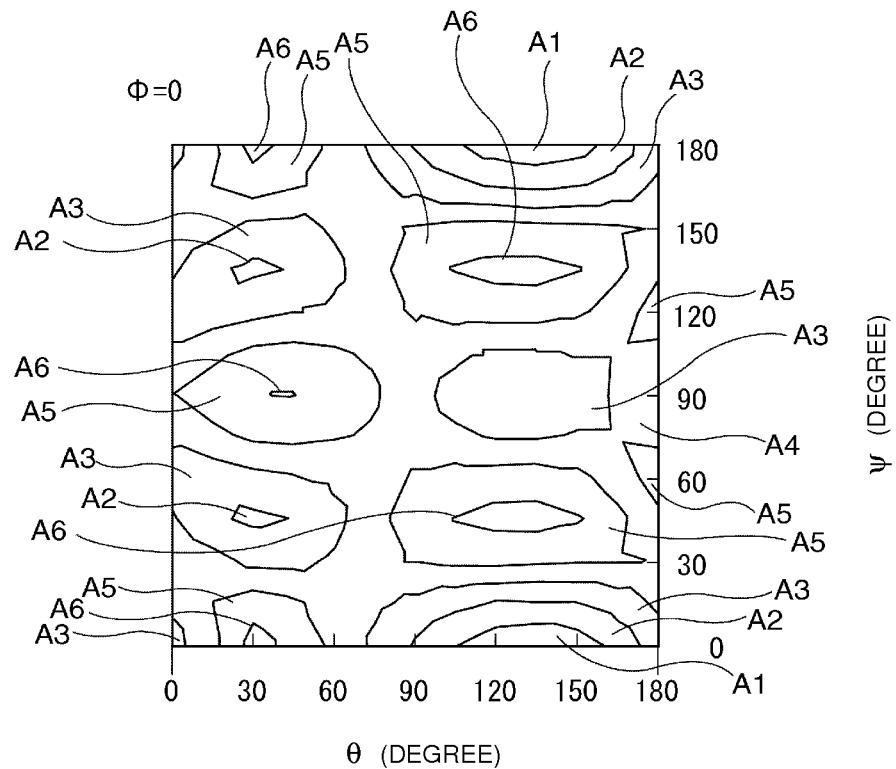
FIG. 2 is a chart representing the relationship between an acoustic velocity of a surface acoustic wave and Euler Angles $\theta$ and $\psi$ in a surface acoustic wave element in which an IDT electrode is provided on a piezoelectric body made of $LiTaO_3$ having Euler Angles (0°, 0° to 180°, 0° to 180°).
Figure 3:
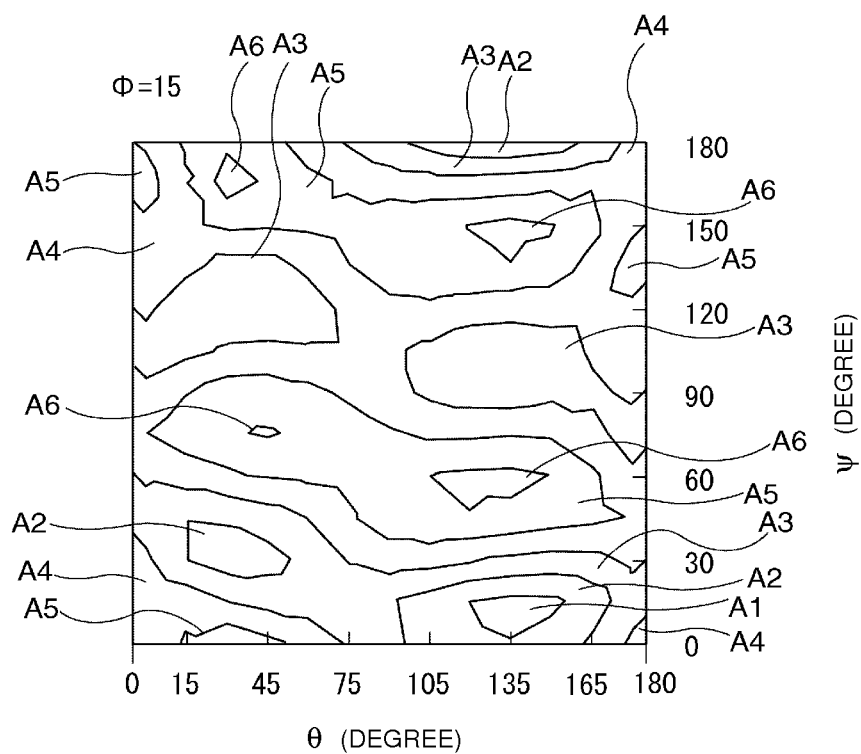
FIG. 3 is a chart representing the relationship between an acoustic velocity of a surface acoustic wave and Euler Angles $\theta$ and $\psi$ in a surface acoustic wave element in which an IDT electrode is provided on a piezoelectric body made of $LiTaO_3$ having Euler Angles (15°, 0° to 180°, 0° to 180°).
Figure 4:
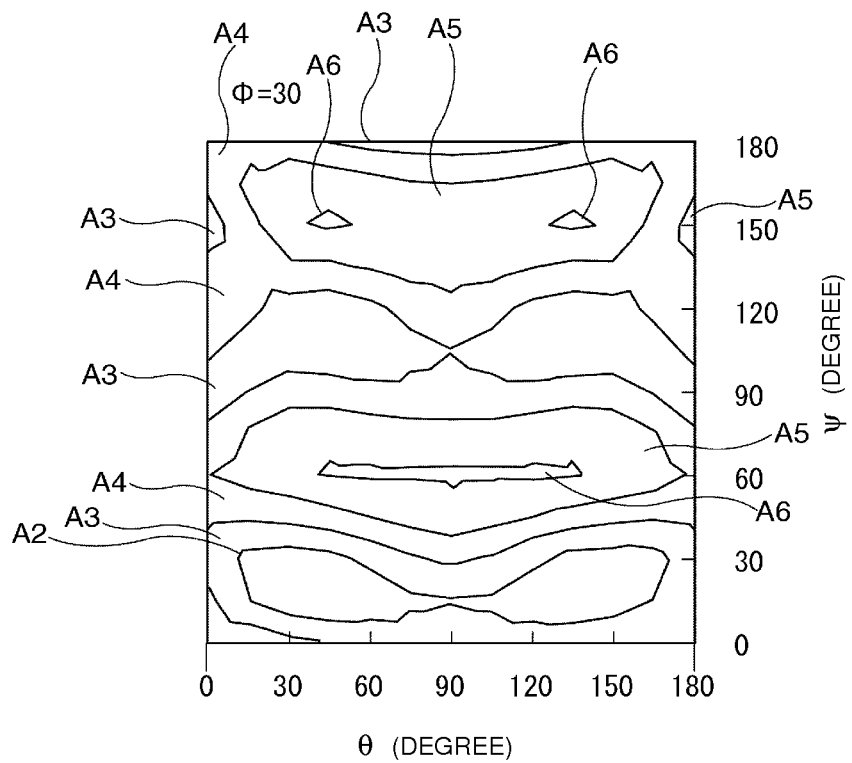
FIG. 4 is a chart representing the relationship between an acoustic velocity of a surface acoustic wave and Euler Angles $\theta$ and $\psi$ in a surface acoustic wave element in which an IDT electrode is provided on a piezoelectric body made of $LiTaO_3$ having Euler Angles (30°, 0° to 180°, 0° to 180°).

FIGS. 2 to 4 are charts representing changes in the acoustic velocity of the surface acoustic wave when LiTaO$_3$ having Euler Angles ($\phi$, $\theta$, $\psi$) was used as the piezoelectric body and Euler Angle $\phi$ was set successively to 0°, 15° and 30°, while $\theta$ was changed from 0° to 180° and $\psi$ was changed from 0° to 180°. Here, the film thickness of the piezoelectric body 4 made of LiTaO$_3$ was set to about 0.5λ, the film thickness of the confinement layer 12 made of silicon nitride was set to about 2.0λ, and the film thickness of the electrode made of λ was set to about 0.08%, for example. Moreover, the wavelength λ determined depending on the pitch of electrode fingers of the IDT was set to λ=2 μm, for example. Euler Angle $\psi$ corresponds to the propagation azimuth.

It is to be noted that signs A1 to A6 in FIGS. 2 to 4 indicate respective ranges of the acoustic velocity listed in Table 1 below.

TABLE 1

| | Acoustic Velocity (m/sec) |
|---|---|
| A1 | not less than 3900 to less than 4000 |
| A2 | not less than 3800 to less than 3900 |
| A3 | not less than 3700 to less than 3800 |
| A4 | not less than 3600 to less than 3700 |
| A5 | not less than 3500 to less than 3600 |
| A6 | not less than 3400 to less than 3500 |

Figure 5:
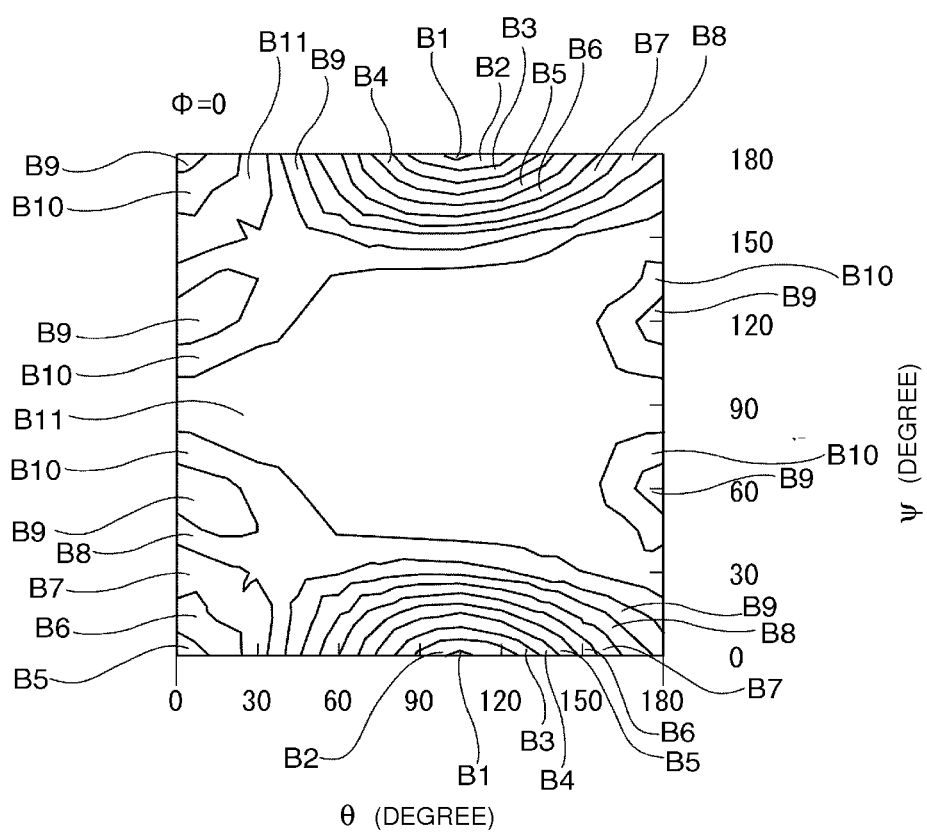
FIG. 5 is a chart representing the relationship between a band width of a surface acoustic wave and Euler Angles $\theta$ and $\psi$ in the surface acoustic wave element in which the IDT electrode is provided on the piezoelectric body made of $LiTaO_3$ having Euler Angles (0°, 0° to 180°, 0° to 180°).
Figure 6:
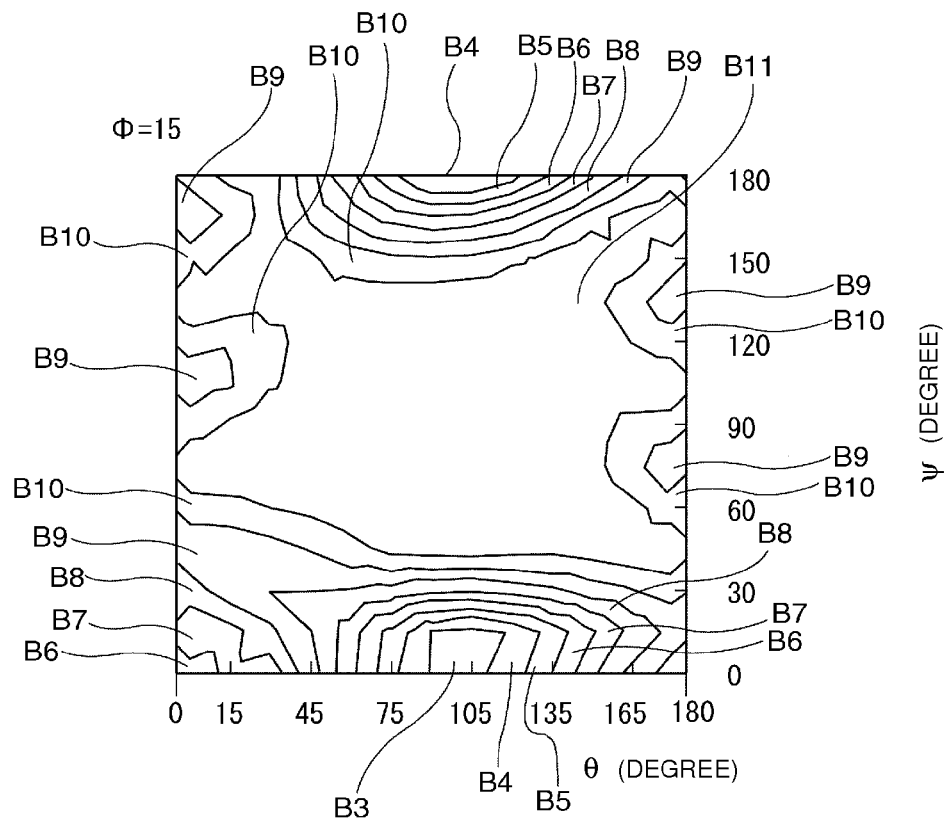
FIG. 6 is a chart representing the relationship between a band width of a surface acoustic wave and Euler Angles $\theta$ and $\psi$ in the surface acoustic wave element in which the IDT electrode is provided on the piezoelectric body made of $LiTaO_3$ having Euler Angles (15°, 0° to 180°, 0° to 180°).
Figure 7:
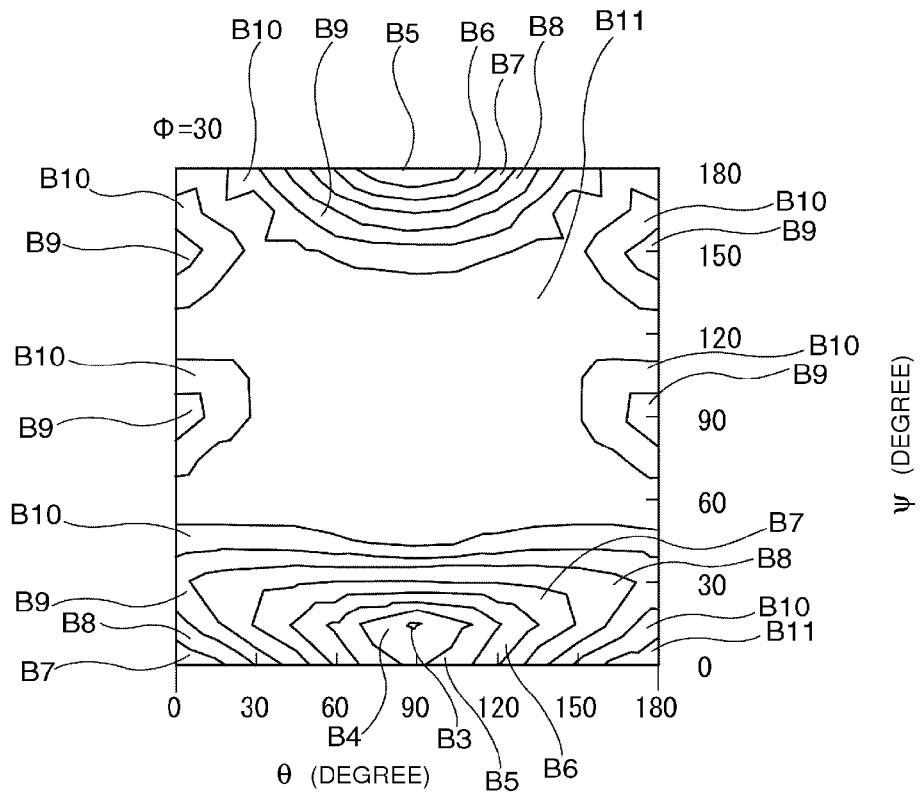
FIG. 7 is a chart representing the relationship between a band width of a surface acoustic wave and Euler Angles $\theta$ and $\psi$ in the surface acoustic wave element in which the IDT electrode is are provided on the piezoelectric body made of $LiTaO_3$ having Euler Angles (30°, 0° to 180°, 0° to 180°).

FIGS. 5 to 7 are charts representing dependency of a band width ratio of the above-described surface acoustic wave device 1 upon Euler Angles. Each chart of the band width ratio represents the simulation result on condition that a frequency difference between an anti-resonance point and a resonance point of a resonator is defined as the band width ratio.

It is to be noted that signs B1 to B11 in FIGS. 5 to 7 indicate respective ranges of the band width listed in Table 2 below.

TABLE 2

| | Band Width (%) |
|---|---|
| B1 | not less than 5.0% to less than 5.5% |
| B2 | not less than 4.5% to less than 5.0% |
| B3 | not less than 4.0% to less than 4.5% |
| B4 | not less than 3.5% to less than 4.0% |
| B5 | not less than 3.0% to less than 3.5% |
| B6 | not less than 2.5% to less than 3.0% |
| B7 | not less than 2.0% to less than 2.5% |
| B8 | not less than 1.5% to less than 2.0% |
| B9 | not less than 1.0% to less than 1.5% |
| B10 | not less than 0.5% to less than 1.0% |
| B11 | not less than 0.0% to less than 0.5% |

Figure 8:
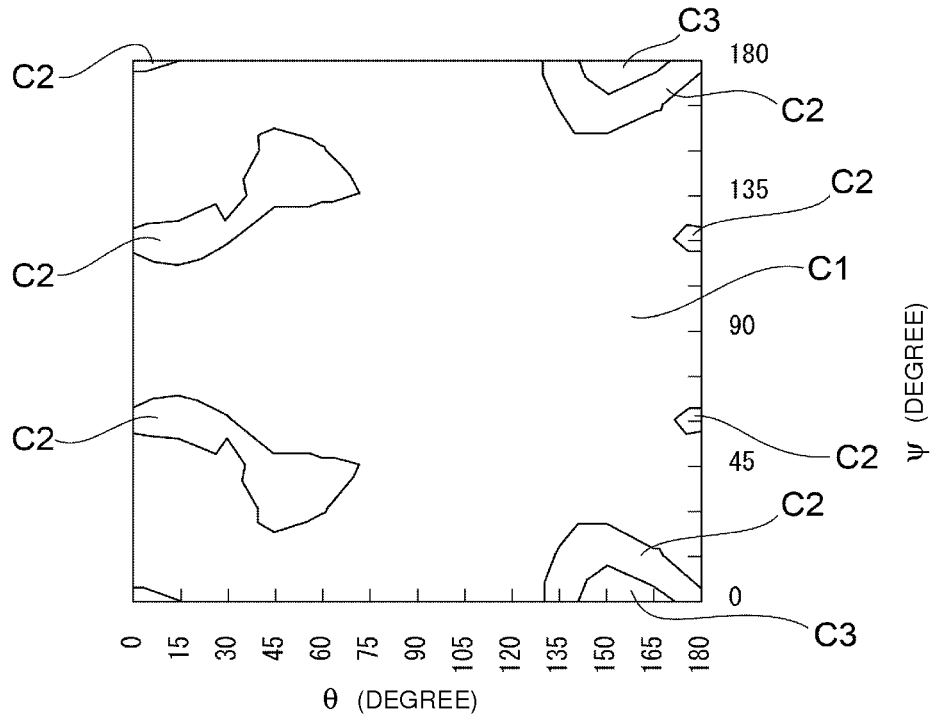
FIG. 8 is a chart representing the relationship between an acoustic velocity of a surface acoustic wave and Euler Angles $\theta$ and $\psi$ in a surface acoustic wave element in which an IDT electrode is provided on a piezoelectric body made of LiNbO₃ having Euler Angles (0°, 0° to 180°, 0° to 180°).
Figure 9:
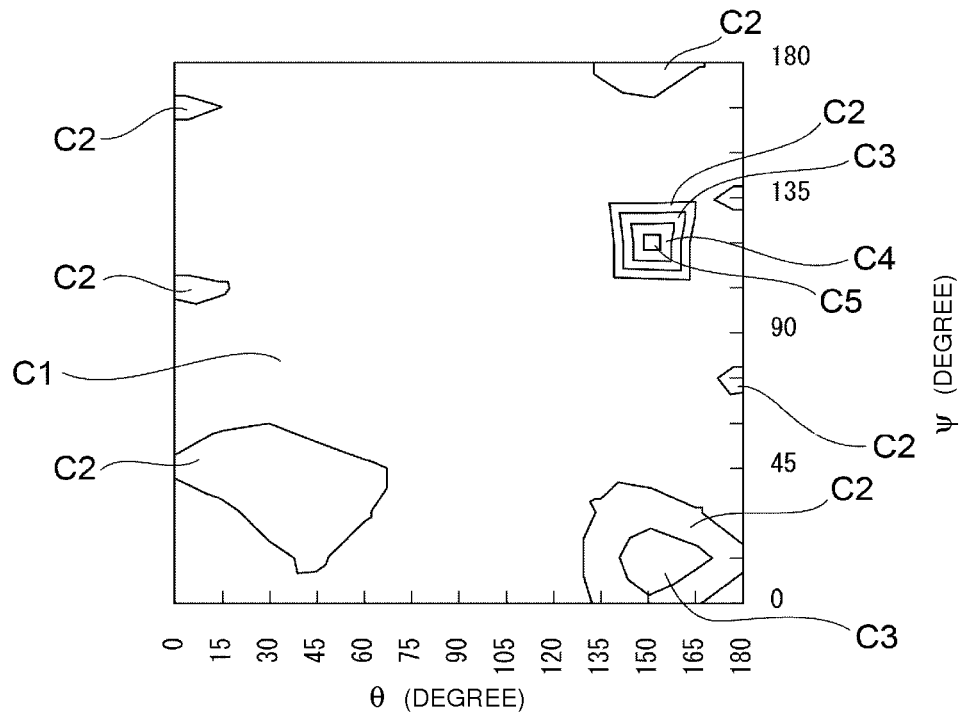
FIG. 9 is a chart representing the relationship between an acoustic velocity of a surface acoustic wave and Euler Angles θ and ψ in a surface acoustic wave element in which an IDT electrode is provided on a piezoelectric body made of LiNbO₃ having Euler Angles (15°, 0° to 180°, 0° to 180°).
Figure 10:
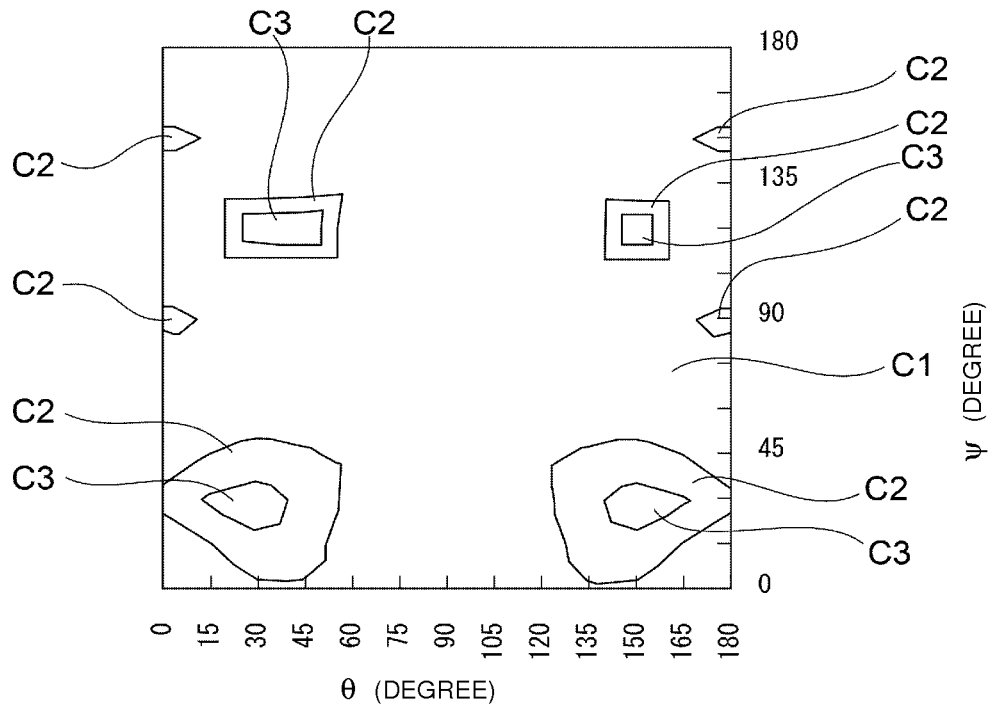
FIG. 10 is a chart representing the relationship between an acoustic velocity of a surface acoustic wave and Euler Angles θ and ψ in a surface acoustic wave element in which an IDT electrode is provided on a piezoelectric body made of LiNbO₃ having Euler Angles (30°, 0° to 180°, 0° to 180°).
Figure 11:
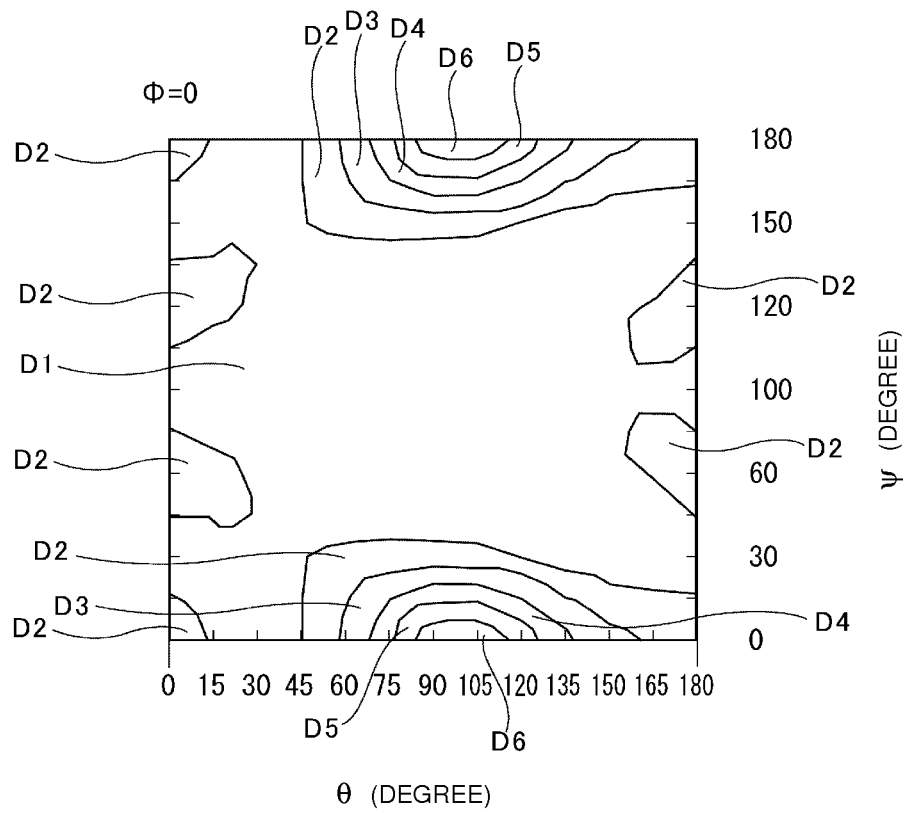
FIG. 11 is a chart representing the relationship between a band width of a surface acoustic wave and Euler Angles θ and ψ in the surface acoustic wave element in which the IDT electrode is provided on the piezoelectric body made of LiNbO₃ having Euler Angles (0°, 0° to 180°, 0° to 180°).
Figure 12:
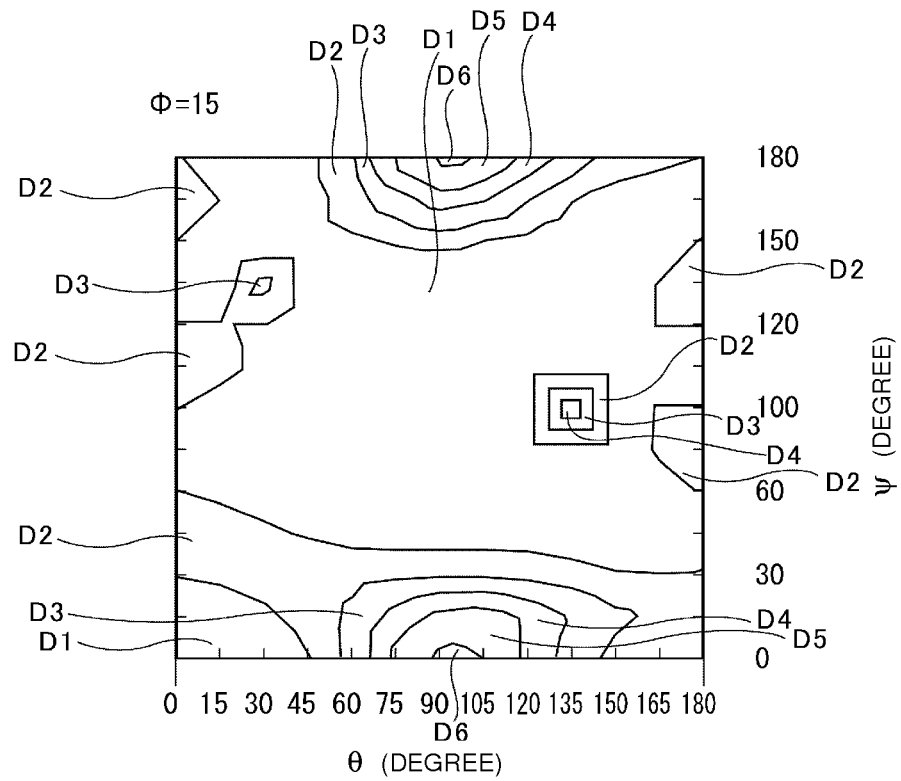
FIG. 12 is a chart representing the relationship between a band width of a surface acoustic wave and Euler Angles θ and ψ in the surface acoustic wave element in which the IDT electrode is provided on the piezoelectric body made of LiNbO₃ having Euler Angles (15°, 0° to 180°, 0° to 180°).
Figure 13:
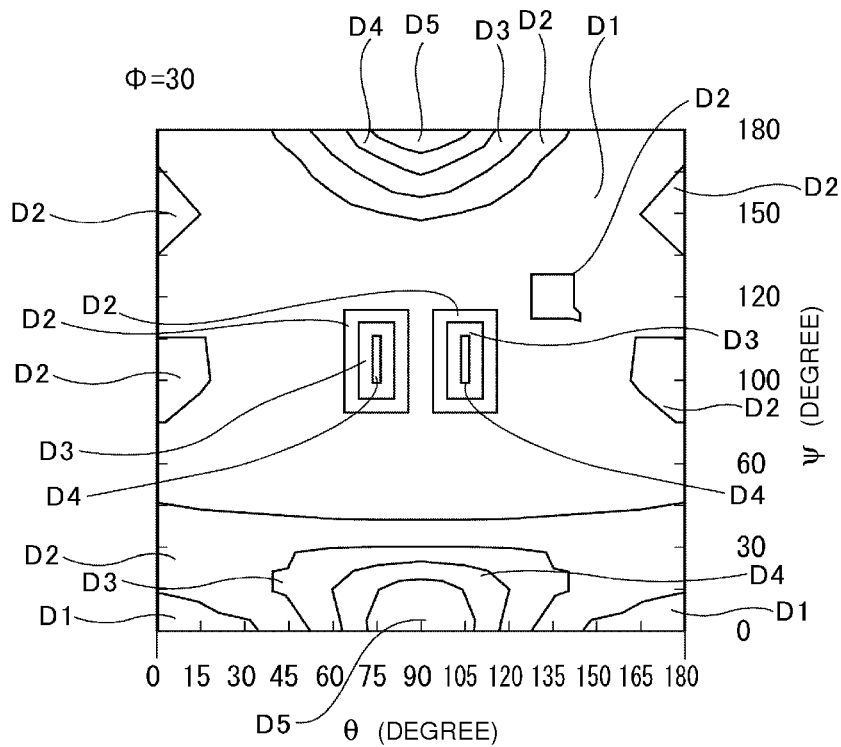
FIG. 13 is a chart representing the relationship between a band width of a surface acoustic wave and Euler Angles θ and ψ in the surface acoustic wave element in which the IDT electrode is provided on the piezoelectric body made of LiNbO₃ having Euler Angles (30°, 0° to 180°, 0° to 180°).

By using LiNbO$_3$ instead of LiTaO$_3$, changes in the acoustic velocity of the surface acoustic wave and changes in the band width were determined while Euler Angles ($\phi$, $\theta$, $\psi$) were changed in a similar manner to that in EXAMPLE 1. The determined results are plotted in FIGS. 8 to 10 and FIGS. 11 to 13. FIGS. 8 to 10 represent the changes in the acoustic velocity of the surface acoustic wave, and FIGS. 11 to 13 represent the changes in the band width.

It is to be noted that signs C1 to C5 in FIGS. 8 to 10 indicate respective ranges of the acoustic velocity listed in Table 3 below.

TABLE 3

| | Acoustic Velocity (m/sec) |
|---|---|
| C1 | less than 4031 |
| C2 | not less than 4031 to less than 4081 |
| C3 | not less than 4081 to less than 4131 |
| C4 | not less than 4131 to less than 4181 |
| C5 | not less than 4181 to less than 4231 |

It is to be noted that signs D1 to D6 in FIGS. 11 to 13 indicate respective ranges of the band width listed in Table 4 below.

TABLE 4

| | Band Width (%) |
|---|---|
| D1 | not less than 0.0% to less than 3.0% |
| D2 | not less than 3.0% to less than 6.0% |
| D3 | not less than 6.0% to less than 9.0% |
| D4 | not less than 9.0% to less than 12.0% |
| D5 | not less than 12.0% to less than 15.0% |
| D6 | not less than 15.0% to less than 18.0% |

As seen from FIGS. 2 to 13, because LiTaO$_3$ and LiNbO$_3$ are anisotropic, the band width of the resonator is changed by changing the propagation azimuth $\psi$.

Furthermore, in the surface acoustic wave device 1 of this preferred embodiment, since the above-described confinement layer 12 is provided, the propagation loss is held substantially at 0 even when the propagation azimuth is changed. Hence, according to the surface acoustic wave device 1 of this preferred embodiment, the band width is adjusted without connecting an additional capacity. Stated in another way, even in the case of utilizing the elastic wave faster than the bulk wave, the band width of the filter is adjusted by setting the propagation azimuth to be different between plural elastic wave elements as in the boundary acoustic wave device disclosed in WO2005/060094. Moreover, since the propagation loss is held substantially at 0 even when the propagation azimuth is changed, a degree of freedom in layout is ensured in design.

While, in the above-described preferred embodiment, the confinement layer 12 preferably is made of silicon nitride, for example, the confinement layer 12 may be made of suitable one of other materials in which the acoustic velocity is high. In such a case, the material of the confinement layer 12 can be appropriately selected from materials in which the acoustic velocity of the bulk wave is higher than that of the elastic wave propagating in the piezoelectric body. For example, aluminum nitride or aluminum oxide can be suitably used as the above-mentioned material. The acoustic velocity of the transversal bulk wave in aluminum nitride is 6016 m/sec, and the acoustic velocity of the transversal bulk wave in aluminum oxide is 6073 m/sec. In addition, a similar advantages effect can also be obtained with other materials including not only silicon carbide, silicon oxynitride, a DLC (diamond-like carbon) film, diamond, sapphire, alumina, magnesia, and silicon, but also lithium tantalate, lithium niobate, or the like having a Cut-Angle selected such that the acoustic velocity of the bulk wave propagating therein is faster than the propagation velocity of the surface acoustic wave. As discussed above, insofar as the acoustic velocity of the bulk wave is higher than that of the elastic wave propagating in the piezoelectric body 4, the propagation loss is held substantially at 0 even when the propagation azimuth is changed.

Preferably, the confinement layer 12 has a higher thermal conductivity. The higher thermal conductivity is effective in increasing heat dissipation performance and in improving reliability when electric power is applied to the device. The thermal conductivity of $LiTaO_3$ in the form of a piezoelectric single-crystal is 2.93 W/m·K and the thermal conductivity of $LiNbO_3$ is 4.6 W/m·K. On the other hand, the thermal conductivity of aluminum nitride is 170 W/m·K, the thermal conductivity of aluminum oxide is 29 W/m·K, and the thermal conductivity of silicon nitride is 25.4 W/m·K. Thus, the confinement layer 12 is preferably made of aluminum nitride, aluminum oxide, or silicon nitride each having good thermal conductivity. Using aluminum nitride is more desirable from the viewpoint of increasing the thermal conductivity.

Figure 14:
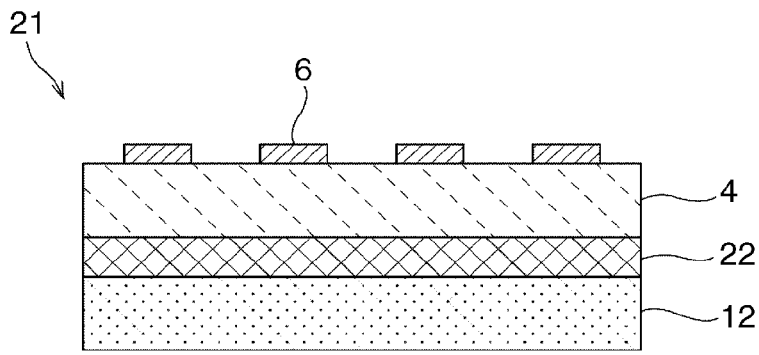
FIG. 14 is a schematic front sectional view illustrating a surface acoustic wave device according to a second preferred embodiment of the present invention.

FIG. 14 is a schematic front sectional view to explain a surface acoustic wave device according to a second preferred embodiment of the present invention. In the second preferred embodiment, a low acoustic velocity film 22 preferably is interposed between the piezoelectric body 4 and the confinement layer 12. Because the other structure is the same as that in the first preferred embodiment, the above description of the first preferred embodiment is applied to a surface acoustic wave device 21 according to the second preferred embodiment as well.

The term "low acoustic velocity film" implies a film in which the acoustic velocity of a bulk wave in the low acoustic velocity film is lower than that of a bulk wave propagating in the piezoelectric body 4. Accordingly, the low acoustic velocity film 22 is made of a material in which the acoustic velocity of the bulk wave is lower than that of the bulk wave propagating in the piezoelectric body 4 and than the acoustic velocity of the bulk wave propagating in the confinement layer 12. In this preferred embodiment, the low acoustic velocity film 22 preferably is made of silicon oxide in which a propagating elastic wave is an SH surface acoustic wave and the acoustic velocity of a bulk wave, i.e., the acoustic velocity of a transversal wave, is 3757 m/sec. When the piezoelectric body 4 is made of $LiTaO_3$, the bulk wave is the SH bulk wave that is the fast transversal wave, and the acoustic velocity thereof is 4212 m/sec. Furthermore, when the confinement layer 12 preferably is made of silicon nitride, the bulk wave is a transversal wave and the acoustic velocity thereof is 5950 m/sec. It is to be noted that the material of the low acoustic velocity film 22 is not limited to silicon oxide, and the low acoustic velocity film 22 may be made of, e.g., silicon oxynitride, tantalum oxide, glass, or a mixture containing silicon oxide as a main component.

Figure 16:
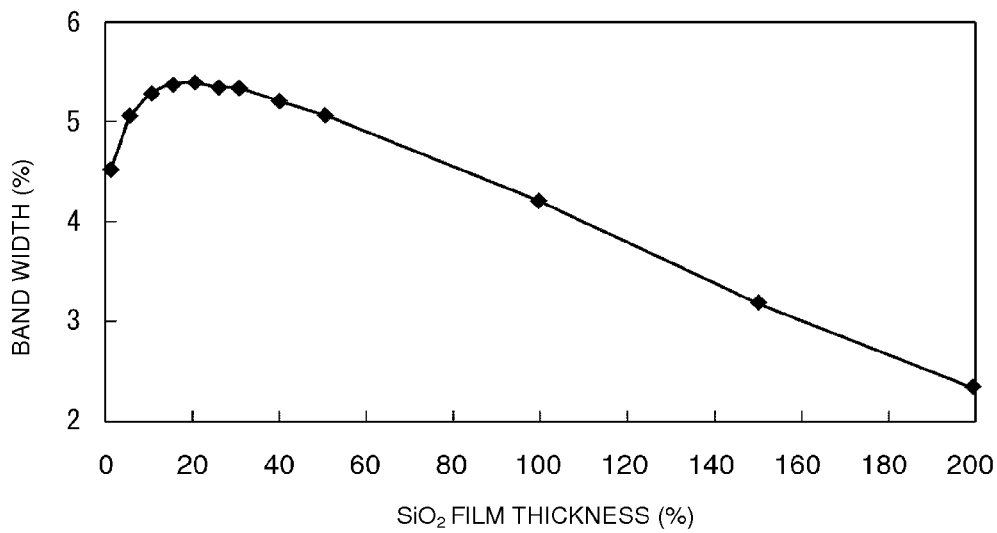
FIG. 16 is a graph representing the relationship between a film thickness of SiO₂ and a band width in the surface acoustic wave device, illustrated in FIG. 14, including the low acoustic velocity film.

Using the low acoustic velocity film 22 also enables the band width to be adjusted. FIG. 16 is a graph representing changes in the band width when a film thickness of silicon oxide forming the low acoustic velocity film 22 was changed in the surface acoustic wave device 21 of the second preferred embodiment. In FIG. 16, the film thickness (%) represents a percentage with respect to a wavelength that is determined depending on the pitch of electrode fingers of the IDT.

In FIG. 16, 0% of the film thickness of silicon oxide corresponds to the result obtained in the first preferred embodiment in which the low acoustic velocity film 22 is not disposed. As seen from FIG. 16, the band width can be changed by changing the film thickness of silicon oxide. In particular, it is seen that when the film thickness of silicon oxide preferably is set to a range of 0% or more to about 82% or less of the wavelength, for example, the band width can be widened in comparison with the case of not providing the low acoustic velocity film. Moreover, it is seen that when the film thickness of silicon oxide is set to be larger than about 82% of the wavelength, the band width is narrowed in comparison with the case of not providing the silicon oxide film.

While FIG. 16 plots the result in the case using the silicon oxide film as the low acoustic velocity film 22, the band width can be adjusted in a similar way when the low acoustic velocity film is made of any other one of the above-mentioned materials.

Figure 15:
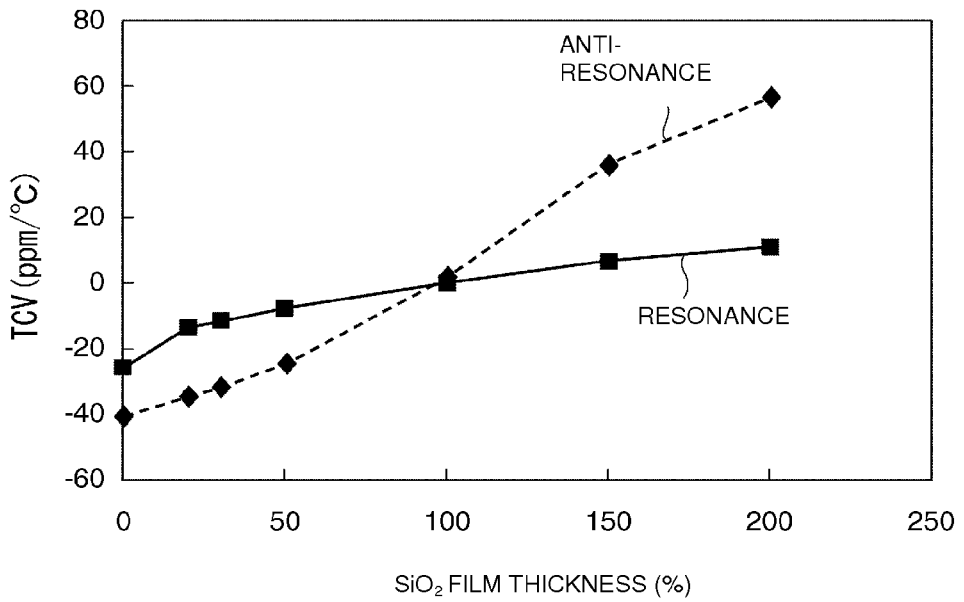
FIG. 15 is a graph representing the relationship between a film thickness of SiO₂ and TCV in the surface acoustic wave device, illustrated in FIG. 14, including a low acoustic velocity film.

Furthermore, when the low acoustic velocity film 22 is made of the silicon oxide film, TCF (temperature coefficient of frequency) of the low acoustic velocity film 22 is a positive value. On the other hand, TCF of the piezoelectric body 4 is a negative value. Accordingly, temperature characteristics are improved by stacking the low acoustic velocity film 22 made of the silicon oxide film. FIG. 15 is a graph representing changes in TCV (temperature coefficient of velocity), i.e., frequency temperature characteristics of the acoustic velocity at a resonant frequency and an anti-resonance frequency when the thickness of the silicon oxide film was changed. As seen from FIG. 15, the temperature characteristics are changed by changing the thickness of the silicon oxide film. In particular, it is seen that when the thickness of the silicon oxide film is set to a range of about 20% to about 150% of the wavelength, for example, TCV at the resonant frequency can be held within a range of about ±10 ppm/° C., and TCV at the anti-resonant frequency can be held within a range of about ±30 ppm/° C., for example.

The frequency temperature characteristics can be improved in a similar way in the cases using, as the low acoustic velocity film, not only silicon nitride or the like in which TCF (temperature coefficient of frequency) is a positive value, but also even a material with TCF having a negative value of which absolute value is smaller than an absolute value of TCF of the piezoelectric single-crystal constituting the piezoelectric body 4.

Influences of the thickness of the electrode in the surface acoustic wave device according to various preferred embodiments of the present invention will be described below.

Figure 17:
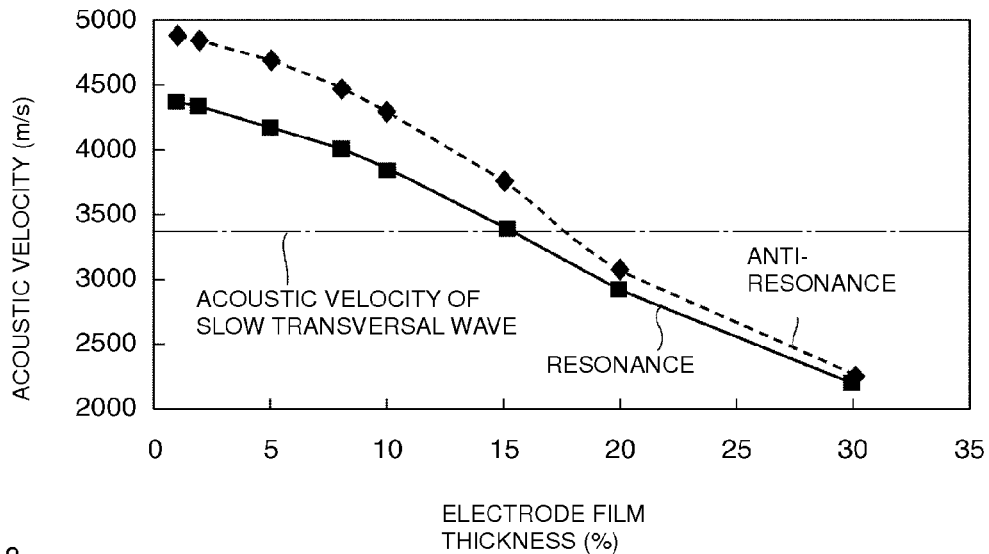
FIG. 17 is a graph representing the relationship between a film thickness of the IDT electrode and an acoustic velocity of a surface acoustic wave at each of a resonance point and an anti-resonance point.

In the surface acoustic wave element, when the film thickness of the electrode is changed, the acoustic velocity of the propagating surface acoustic wave is changed. FIG. 17 is a graph representing the relationship between a film thickness of an electrode and an acoustic velocity of an SH surface acoustic wave excited along the surface of a piezoelectric body in a non-limiting example of a surface acoustic wave element that is configured similarly to the first surface acoustic wave element 2 in the surface acoustic wave device 1 according to the first preferred embodiment. Here, Euler Angles of $LiTaO_3$ were set to (0°, 128.5°, 0°). The thickness of the piezoelectric body 4 made of $LiTaO_3$ was set to about 0.5λ, and the thickness of the confinement layer 12 was set to about 2.0λ, for example. λ=2.0 μm was assumed.

In the structure described above, the film thickness of the IDT electrode made of Al was changed in a range of about 0.01λ to about 0.3λ, for example.

As seen from FIG. 17, when the film thickness of the electrode is changed in the above-described structure, the acoustic velocity at each of a resonant frequency and an anti-resonant frequency is changed. More specifically, as the film thickness of the electrode increases, the resonant frequency and the anti-resonant frequency reduce gradually. It is also seen that, because the acoustic velocity of the slow transversal wave propagating in the piezoelectric body 4 is 3338 m/sec, the surface acoustic wave has a higher acoustic velocity than the bulk wave propagating in the piezoelectric body when the film thickness is in the region of 15% or less.

In order to utilize, as described above, the surface acoustic wave having a higher acoustic velocity than the bulk wave propagating in the piezoelectric body, the film thickness of the electrode needs to be set to a thickness at which the acoustic velocity of the surface acoustic wave is higher than that of the slow transversal wave propagating in the piezoelectric body 4. Although such a film thickness of the electrode differs depending on materials used, it is only necessary to adjust the acoustic velocity of the surface acoustic wave to be higher than that of the slow transversal wave, as plotted in FIG. 17, by properly selecting the materials that are used for the piezoelectric body and the electrode.

As well known, in the surface acoustic wave device, the acoustic velocity of the surface acoustic wave can also be changed by changing a duty ratio of the IDT electrode. Stated in another way, the surface acoustic wave having a higher acoustic velocity than the bulk wave propagating in the piezoelectric body can be utilized by setting the duty ratio to such a value at which the acoustic velocity of the surface acoustic wave is higher than that of the slow transversal wave propagating in the piezoelectric body 4.

While, in the second preferred embodiment described above, a transversal wave is preferably used as the surface acoustic wave having a higher acoustic velocity than the bulk wave propagating in the piezoelectric body, a longitudinal wave may be used as the surface acoustic wave having a higher acoustic velocity than the bulk wave propagating in the piezoelectric body. In such a case, the thickness of the IDT electrode is preferably set to a thickness at which the acoustic velocity of the surface acoustic wave is higher than that of the longitudinal bulk wave propagating in the piezoelectric body. Furthermore, when a longitudinal wave is used as the surface acoustic wave having a higher acoustic velocity than the bulk wave propagating in the piezoelectric body, the duty ratio of the IDT electrode is preferably set to a value at which the acoustic velocity of the surface acoustic wave is higher than that of the longitudinal bulk wave propagating in the piezoelectric body. By setting the thickness and/or the duty ratio of the IDT electrode to the preferable values as described above, the surface acoustic wave having a higher acoustic velocity than the bulk wave propagating in the piezoelectric body is capable of being reliably utilized as in the above-described preferred embodiment. Particularly, since the acoustic velocity of the surface acoustic wave is reliably increased in comparison with the non-leaky surface acoustic wave, it is possible to increase the pitch of the IDT. As a result, a filter that is more suitable for use in a higher frequency range is provided.

Figure 18:
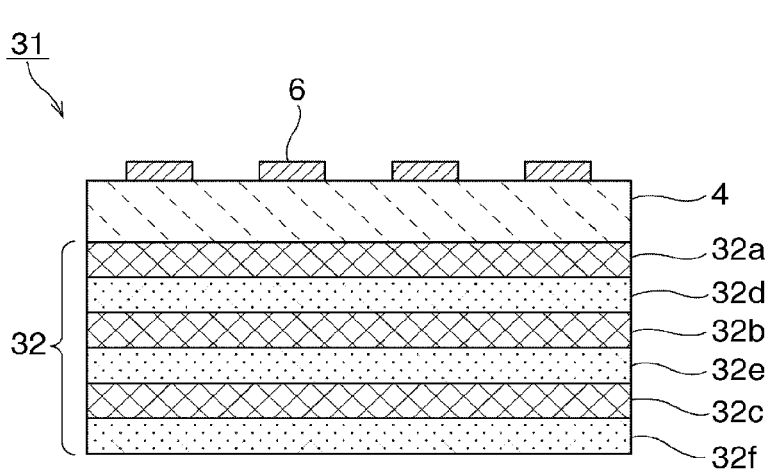
FIG. 18 is a schematic front sectional view to explain a surface acoustic wave device according to a third preferred embodiment of the present invention.

FIG. 18 is a schematic front sectional view to explain a surface acoustic wave device according to a third preferred embodiment of the present invention. In a surface acoustic wave device 31 according to the third preferred embodiment, a confinement layer 32 preferably is stacked adjacent to the lower surface of the piezoelectric body 4.

The confinement layer 32 has a structure in which first material layers 32a to 32c each having a relatively high acoustic impedance and second material layers 32d to 32f each having a relatively low acoustic impedance are stacked. In more detail, the first material layers 32a to 32c and the second material layers 32d to 32f are alternately stacked. The first material layer 32a is stacked in contact with the piezoelectric body 4.

Each of the first material layers 32a to 32c and the second material layers 32d to 32f has a thickness of about ¼ wavelength, for example. Thus, the confinement layer 32 constitutes a Bragg reflector.

The first material layers can be made of, e.g., Cu, Au, Mo, Ni or W. The second material layers can be made of, e.g., silicon oxide or suitable one of various polymers.

The first and second material layers 32a to 32f can be stacked by suitable one of various methods including, e.g., sputtering, vapor deposition, and printing.

In the surface acoustic wave device 31, since the confinement layer 32 is provided as the Bragg reflector, the surface acoustic wave propagating toward the confinement layer 32 from the piezoelectric body 4 is reflected by the confinement layer 32. Accordingly, even when the propagation azimuth is changed, the propagation loss is held substantially at 0. Thus, the confinement layer included in various preferred embodiments of the present invention is not limited to the confinement layer made of the material in which, as described above, the bulk wave therein propagates at a higher acoustic velocity than the bulk wave propagating in the piezoelectric body, and the confinement layer may be configured as the Bragg reflector.

The surface acoustic wave device according to various preferred embodiments of the present invention preferably includes a plurality of surface acoustic wave elements. In that case, the plural surface acoustic wave elements 2 and 3 are preferably provided on one piezoelectric body 4 as in the first preferred embodiment. With such an arrangement, the surface acoustic wave device 1 preferably is configured as a single chip. In the present invention, as an alternative, the plural surface acoustic wave elements may be configured on separate piezoelectric bodies. In such a case, the confinement layer may be stacked adjacent to the lower surface of the piezoelectric body in each of the surface acoustic wave elements.

Furthermore, in the surface acoustic wave device including the plural surface acoustic wave elements, according to various preferred embodiments of the present invention, a circuit configuration of the plural surface acoustic wave elements and applications of the surface acoustic wave device are not limited to particular ones. Application examples of the surface acoustic wave device according to various preferred embodiments of the present invention will be described below with reference to FIGS. 19 to 22.

Figure 19:
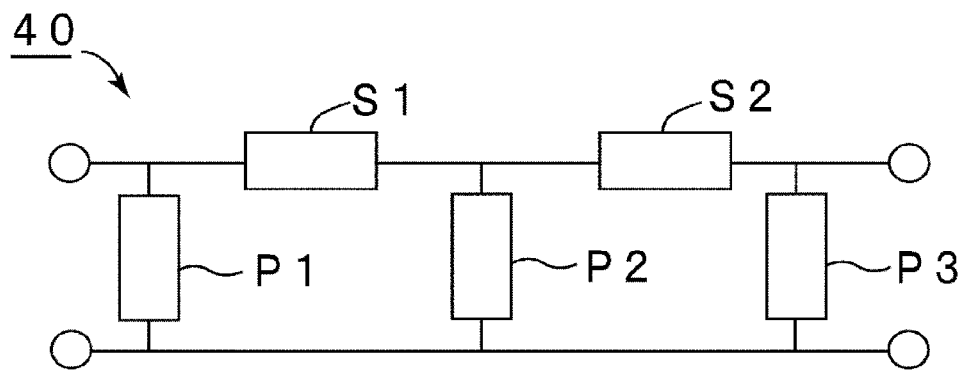
FIG. 19 is a circuit diagram of a ladder filter as one example of the surface acoustic wave device to which one of the preferred embodiments of the present invention is applied.

FIG. 19 is a circuit diagram of a ladder filter 40. In the ladder filter 40, a plurality of serial arm resonators S1 and S2 and a plurality of parallel arm resonators P1 to P3 constitute a ladder circuit. When the serial arm resonators S1 and S2 and the parallel arm resonators P1 to P3 each include a surface acoustic wave element, it is only necessary that each surface acoustic wave resonator is configured in accordance with one of the preferred embodiments of the present invention. Also in this case, the band width of each resonator is easily adjusted by setting the propagation azimuths of surface acoustic waves to be different as described above. Furthermore, with the adjustment of the band width, a degree of freedom in design is significantly improved, and sharpness in the vicinity of a pass band is increased while a filter band necessary for the latter filter 40 is ensured.

The improvement to the performance of the surface acoustic wave device with the structure in which the band width is adjusted by changing the electromechanical coupling coefficient $k^2$ based on the propagation azimuth is applicable not only in the above-described ladder filter 40 to increase the sharpness in the vicinity of its pass band, but also in other various configurations. For example, as illustrated in FIG.

Figure 20A:
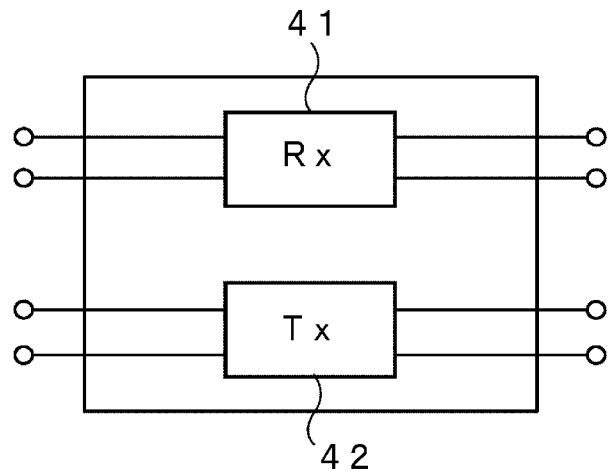
FIGS. 20A and 20B are schematic circuit diagrams representing other examples of a filter to which one of the preferred embodiments of the present invention is applied.
Figure 20B:
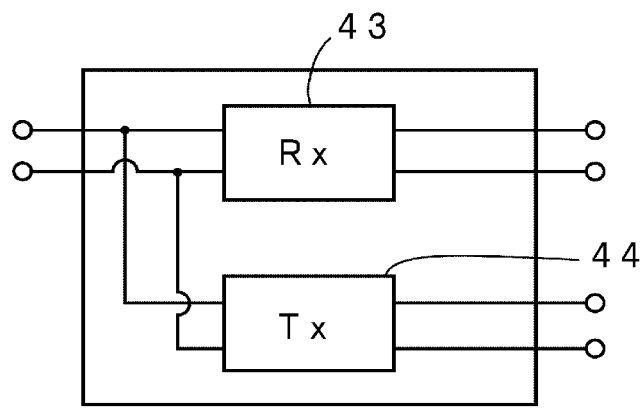

20A, the above-mentioned improvements can also be applied to a filter chip of 2-input and 2-output type having two bands, which includes an Rx filter 41 and a Tx filter 42 configured as one chip. In FIG. 20A, an improvement similar to the above-described one can be used, for example, to increase sharpness on the lower frequency side of the Rx filter 41, or to increase sharpness on the higher frequency side of a pass band of the Tx filter 42. As illustrated in FIG. 20B, the above-mentioned improvement can further be similarly applied to a filter of 1-input and 2-output type having two bands. In the filter illustrated in FIG. 20B, respective inputs of an Rx filter 43 and a Tx filter 44 are connected in common.

Figure 21:
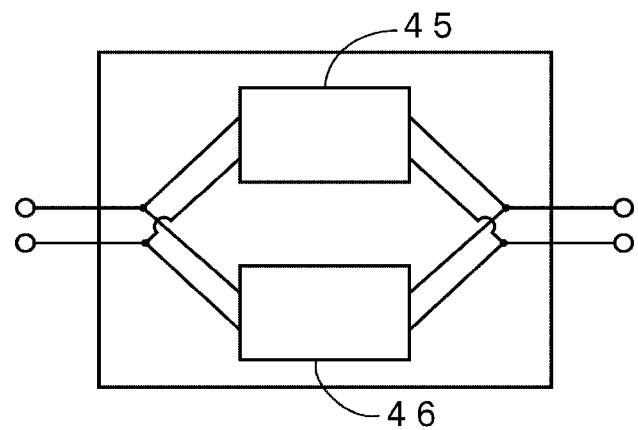
FIG. 21 is a schematic circuit diagram to explain still another example of the surface acoustic wave device to which one of the preferred embodiments of the present invention is applied.

Moreover, a wide-band filter preferably is provided by, in a configuration including a plurality of surface acoustic wave filters connected in parallel or in series, by designing the filters such that the higher or lower frequency side of a pass band of one of the surface acoustic wave filters is contiguous to the lower or higher frequency side of a pass band of another surface acoustic wave filter. In that case, the ends of two pass bands are preferably contiguous to each other in a range with an attenuation of about 3 dB, for example. By including, in the above-mentioned design, a plurality of surface acoustic wave filters in which the propagation azimuth is changed in accordance with various preferred embodiments of the present invention, and by setting one of the surface acoustic wave filters to have a wide band and another surface acoustic wave filter to have a narrow band, it is possible to increase sharpness on either the higher or lower frequency side of the pass band. Thus, as illustrated in FIG. 21, a first surface acoustic wave filter 45 and a second surface acoustic wave filter 46 may be connected in parallel. In such a configuration, wide-band filter characteristics can also be easily designed by adjusting the propagation azimuths of the filters in accordance with various preferred embodiments of the present invention.

Figure 22:
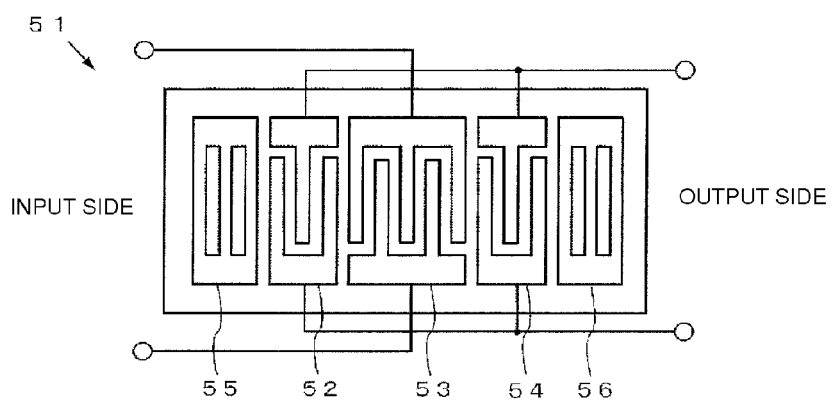
FIG. 22 is a schematic plan view illustrating an electrode structure of a longitudinally coupled filter as one example of the surface acoustic wave device to which one of the preferred embodiments of the present invention is applied.

A longitudinally coupled filter may be configured using the surface acoustic wave device according to various preferred embodiments of the present invention. FIG. 22 is a schematic plan view illustrating an electrode structure when a longitudinally coupled filter is provided.

As illustrated in FIG. 22, in a longitudinally coupled filter 51, three IDTs 52 to 54 are arranged side by side in the propagation direction of the surface acoustic wave. Reflectors 55 and 56 are arranged on both sides, in the propagation direction of the surface acoustic wave, of a region where the IDTs 52 to 54 are arranged. The IDT 53 arranged at a center is connected to an input terminal, whereas respective one ends of the IDTs 52 and 54 are connected in common and further connected to an output terminal. In other words, the longitudinally coupled filter 51 preferably is a 3-IDT longitudinally coupled surface acoustic filter.

Thus, preferred embodiments of the present invention can be applied to the above-described surface acoustic wave filter of longitudinally coupled resonator type as well.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a plurality of surface acoustic wave elements including piezoelectric bodies having a same cut-angle and each configured to use a surface acoustic wave with a higher acoustic velocity than a bulk wave that propagates through the piezoelectric body; wherein
each of the plurality of surface acoustic wave elements includes an IDT electrode disposed on the piezoelectric body, and a confinement layer disposed on the piezoelectric body at a side opposite to a side where the IDT electrode is disposed and configured to confine the surface acoustic wave inside the piezoelectric body;
in the plurality of surface acoustic wave elements, a propagation azimuth of the surface acoustic wave in at least one of the plurality of surface acoustic wave elements is different from a propagation azimuth of the surface acoustic wave in at least another one of the plurality of surface acoustic wave elements.

2. The surface acoustic wave device according to claim 1, wherein the plurality of surface acoustic wave elements are provided on a single piezoelectric body.

3. The surface acoustic wave device according to claim 1, wherein a band width of at least one of the plurality of surface acoustic wave elements is different from a band width of at least another one of the plurality of surface acoustic wave elements.

4. The surface acoustic wave device according to claim 1, wherein the confinement layer is made of a dielectric configured such that an acoustic velocity of a bulk wave propagating in the confinement layer is higher than a propagation velocity of the surface acoustic wave.

5. The surface acoustic wave device according to claim 4, wherein the dielectric is made of one type of dielectric material, or a mixture of dielectric materials, or a stack of plural dielectric materials selected from among a group consisting of aluminum nitride, silicon nitride, aluminum oxide, silicon oxynitride, and DLC.

6. The surface acoustic wave device according to claim 1, wherein the surface acoustic wave is a transversal wave, and a thickness of the IDT electrode is configured such that an acoustic velocity of the surface acoustic wave is higher than an acoustic velocity of a slow transversal wave propagating in the piezoelectric body.

7. The surface acoustic wave device according to claim 1, wherein the surface acoustic wave is a longitudinal wave, and a thickness of the IDT electrode is configured such that an acoustic velocity of the surface acoustic wave is higher than an acoustic velocity of a longitudinal bulk wave propagating in the piezoelectric body.

8. The surface acoustic wave device according to claim 1, wherein the surface acoustic wave is a transversal wave, and a duty ratio of the IDT electrode is a duty ratio at which the surface acoustic wave is faster than an acoustic velocity of a slow transversal wave propagating in the piezoelectric body.

9. The surface acoustic wave device according to claim 1, wherein the surface acoustic wave is a longitudinal wave, and a duty ratio of the IDT electrode is a duty ratio at which the surface acoustic wave is faster than an acoustic velocity of a longitudinal bulk wave propagating in the piezoelectric body.

10. The surface acoustic wave device according to claim 1, further comprising a low acoustic velocity layer in which an acoustic velocity of a bulk wave therein is lower than an acoustic velocity of a bulk wave propagating in the piezoelectric body and lower than an acoustic velocity of a bulk wave propagating in the confinement layer, the low acoustic velocity layer being disposed between the piezoelectric body and the confinement layer.

11. The surface acoustic wave device according to claim 10, wherein the low acoustic velocity layer is made of silicon oxide.

12. The surface acoustic wave device according to claim 1, wherein the confinement layer is a Bragg reflector in which a first material layer having a relatively high acoustic impedance and a second material layer having a relatively low acoustic impedance are stacked on each other.

13. The surface acoustic wave device according to claim 12, wherein the first material layer is made of at least one material selected from a group consisting of Cu, Au, Mo, Ni and W.

14. The surface acoustic wave device according to claim 12, wherein the second material layer is made of silicon oxide or a polymer.

15. The surface acoustic wave device according to claim 1, wherein the surface acoustic wave device is a filter or a resonator.

16. The surface acoustic wave device according to claim 15, wherein the surface acoustic wave device is a longitudinally coupled surface acoustic wave filter.

* * * * *